United States Patent [19]

Norman

[11] Patent Number: 5,525,827
[45] Date of Patent: Jun. 11, 1996

[54] UNERASABLE ELECTRONIC PROGRAMMABLE READ ONLY MEMORY (UPROM™)

[76] Inventor: Kevin A. Norman, 2609 Hastings Dr., Belmont, Calif. 94002

[21] Appl. No.: 148,059

[22] Filed: Nov. 5, 1993

[51] Int. Cl.⁶ .................................................. H01L 31/0232
[52] U.S. Cl. .................................. 257/435; 257/758
[58] Field of Search .................................. 257/435, 315, 257/390, 758

[56] References Cited

U.S. PATENT DOCUMENTS

| | | | |
|---|---|---|---|
| 3,728,695 | 4/1973 | Frohman-Bentchkowsky | 356/185 |
| 3,744,036 | 7/1973 | Frohman-Bentchkowsky | 365/185 |
| 3,792,319 | 2/1974 | Tsang | 257/529 |
| 3,996,657 | 12/1976 | Simko et al. | 437/43 |
| 4,250,570 | 2/1981 | Tsang et al. | 365/200 |
| 4,519,050 | 5/1985 | Folmsbee | 365/53 |
| 4,530,074 | 6/1985 | Folsmbee | 257/435 |
| 4,942,450 | 7/1990 | Iwashita | 257/435 |

*Primary Examiner*—Sara W. Crane
*Attorney, Agent, or Firm*—Townsend and Townsend and Crew

[57] ABSTRACT

A shielded electronically programmable read only memory (UPROM™) having memory cells enclosed in a shield structure which protects the content of the memory cells from erasure UV rays is described. In addition to protecting the memory cells, the UPROM provides for accessing the cells from all sides of the shield structure without compromising its protective function. In one embodiment of the present invention, a UPROM having a two dimensional array of EPROM cells is described.

48 Claims, 7 Drawing Sheets

UNERASABLE ELECTRONIC PROGRAMMABLE READ ONLY MEMORY (UPROM™)

BACKGROUND OF THE INVENTION

This invention relates to the field of Electrically Programmable Read-Only Memory (EPROM) devices. More specifically, it relates to shield structures which protect EPROMs from radiation.

Metal-Oxide-Semiconductors (MOS) Electrically Programmable Read Only Memories (EPROMs) have been utilized for the storage of information in prior art. U.S. Pat. No. 3,996,657 describes a typical cell for the above memories. These memory cells are susceptible to ultraviolet ("UV") radiation, and upon exposure to the radiation their contents are erased. These memory cells are used to construct arrays of memory cells as described in U.S. Pat. Nos. 3,728,695 and 3,744,036.

Redundant rows and columns have been utilized in prior art for replacing defective rows and columns in Read-Only Memories (ROMs) and Random-Access Memories (RAMs). Fusible silicon links are used to enable these redundant elements. (A process for making a PROM employing fusible silicon links is described in U.S. Pat. No. 3,792,319.) U.S. Pat. No. 4,250,570, for example, describes a memory employing redundant elements.

It is an object of the present invention to provide a shield to protect areas of an integrated circuit which is sensitive to radiation.

It is another object of the present invention to provide a shield that includes signal paths to access the above sensitive areas from all directions.

It is yet another object of the present invention to provide shielded memory cells that can be used in place of the above-mentioned fusible silicon links.

SUMMARY OF THE INVENTION

The present invention is directed to an Unerasable Programmable Read Only Memory (UPROM™) structure. The structure of the present invention includes a cell area having EPROM memory cells, a first shield positioned around the cell area to substantially block any impinging Ultra Violet ("UV") radiation from all sides of the cell area, and a second shield connected to the top of the structure to block any impinging UV radiation from the top of the structure. Furthermore, there are a plurality of signal paths positioned around the structure to provide for accessing the cell area from all sides.

In one embodiment of the present invention, the first shield includes a plurality of shielding members positioned around the cell area. Each two adjacent shielding members are connected to provide a continuous shield around the cell area. Each shielding member includes one signal path and has a labyrinthine structure that substantially diminishes and in some cases completely blocks any radiation entering the signal path.

As a result, the present invention provides a UPROM structure having several signal paths positioned around the structure to facilitate accessing the cell area from all sides. The present invention also provides a narrow aperture for each signal path to limit radiation entering the signal path. The present invention also provides shielding members, each having a signal path. Furthermore, the shielding members have a labyrinthine structure to substantially diminish and in many cases eliminate radiation entering its signal path. Still further, the present invention provides shielded memory cells which can be used to enable redundant memory arrays. Finally, the present invention provides a UPROM structure capable of shielding a two dimensional memory array.

DESCRIPTION OF THE PREFERRED EMBODIMENTS

EPROM cells are memory cells that can be electrically programmed and erased repeatedly by exposure to UV radiation. Erasure typically occurs when the EPROM is exposed to specific doses of radiation, such as UV radiation.

The present invention provides a shield structure that protects EPROM cells from exposure to UV radiation, thus protecting the information content of each memory cell. In one embodiment, the invention enables fabrication of EPROM cells, some of which can be erased and some of which cannot be erased on a single circuit die.

Figure 1:
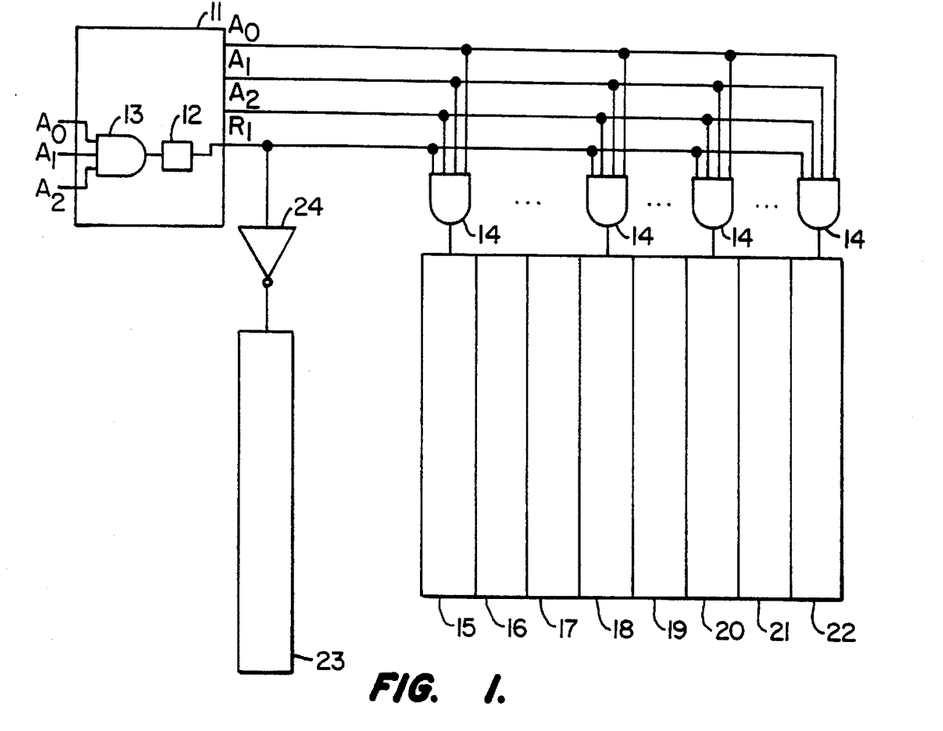
FIG. 1 illustrates a typical application of a shielded EPROM cell.

FIG. 1 illustrates one application of a shielded EPROM memory cell. FIG. 1 shows a typical memory that is divided into memory columns 15–22, and includes at least one redundant memory column 23. If any one of memory columns 15–22 is defective, redundant memory column 23 replaces the defective column. Control unit 11 includes a shielded EPROM cell 12 and AND gate 13. Inputs of control unit 11 are address lines A0–A2 and it outputs are address lines A0–A2 and redundant signal line R1.

Assume that memory column 18 is defective and that the content of EPROM 12 is used to select redundant memory column 23. Furthermore, assume that EPROM 12 holds a logic "0" bit. In the circuit of FIG. 1, EPROM 12 has the same address as defective memory column 18. Therefore, whenever defective memory column 18 is selected by the information in address lines $A_0$–$A_2$, AND gate 13 generates a logic "1" at its output which selects EPROM 12. Once EPROM 12 is selected, its stored value, logic level "0", is placed on R1. A logic "0" on R1 forces the output of AND gates 14 to logic "0" which deactivates memory column 18. Since $A_0$–$A_2$ carry the address of memory column 18, memory columns 15–17 and 19–22 are also not selected, i.e. outputs of other AND gates 14 are also logic "0". Inverter 24 generates an inverted R1 signal, a logic "1", at its output. The output of inverter 24 is used to select redundant memory column 23.

As mentioned before, prior art teaches that fusible silicon links could be used in control unit 11 to select redundant elements. There are two types of fuses used in constructing fusible silicon links, electrically blown fuses and laser blown fuses. However, there are many problems associated with using such fuses. For example, since electrically blown fuses are additional circuit elements in a memory chip, their fabrication must be carefully monitored and characterized. This is in addition to monitoring and characterizing the typical elements of an EPROM cell. Furthermore, these fuses are difficult to manufacture in a consistent manner. Some fuses may be blown at a particular current while other may require a higher current. The unreliability of these fuses is a significant problem.

Still further, silicon fuses require significantly more silicon substrate area as compared to memory cells. This results in a higher overall cost of the memory chip. Finally, an opening in the oxide is normally made above the fuse so that the fuse can be reliably blown and yet protected from blowing spuriously. However, such an opening allows foreign material to accumulate on the fuse, which further contributes to reliability problems.

With laser blown fuses, although there are less stringent uniformity requirements, a special process is required to ensure that the oxide layer over the fuse element has a thickness of 5,000 Å to 10,000 Å. Furthermore, the post manufacturing step of passing the tested wafers through a laser system is required to selectively blow the fuses. From the above it is clearly obvious that the shielded memory cells of the present invention are superior to fusible silicon links.

There are other applications for shielded EPROM cells of the present invention. For example, shielded EPROM cells can be used to digitally adjust reference voltages (e.g., a particular reference voltage would result depending on the number of shielded EPROM cells programmed) to change speed and power dissipation. Since the content of the shielded EPROM cells are protected, there is no need to reprogram the shielded memory cell each time that EPROM chip, which includes the above shielded cells, is exposed to UV radiation in order to be erased and reprogrammed thereafter.

Figure 2A:
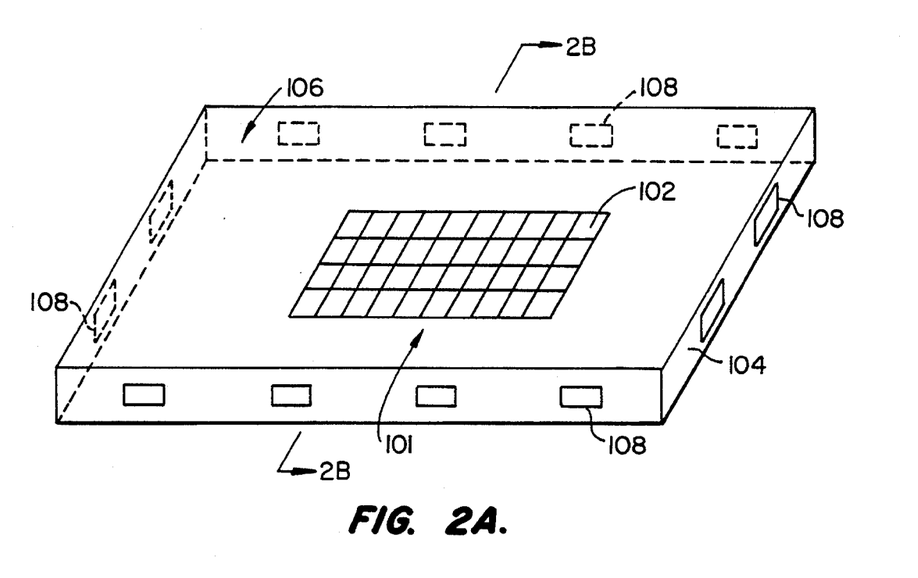
FIG. 2A illustrates an Unerasable Programmable Read Only Memory (UPROM™) structure according to the present invention.

FIG. 2A illustrates a UPROM™ structure 100 according to the present invention. Structure 100 includes EPROM memory cells 102 which are surrounded by a first shield 104 and a second shield 106. Shield 104 protects EPROM memory cells 102 from all UV radiation impinging from all sides of structure 100. Shield 106 protects EPROM memory cells 102 from UV radiation impinging on structure 100 from the top. Structure 100 further includes conductive signal paths 108 which are positioned around memory cells 102. These conductive paths are formed in first shield 104 and provide for paths to access memory cells 102 from outside.

Figure 2B:
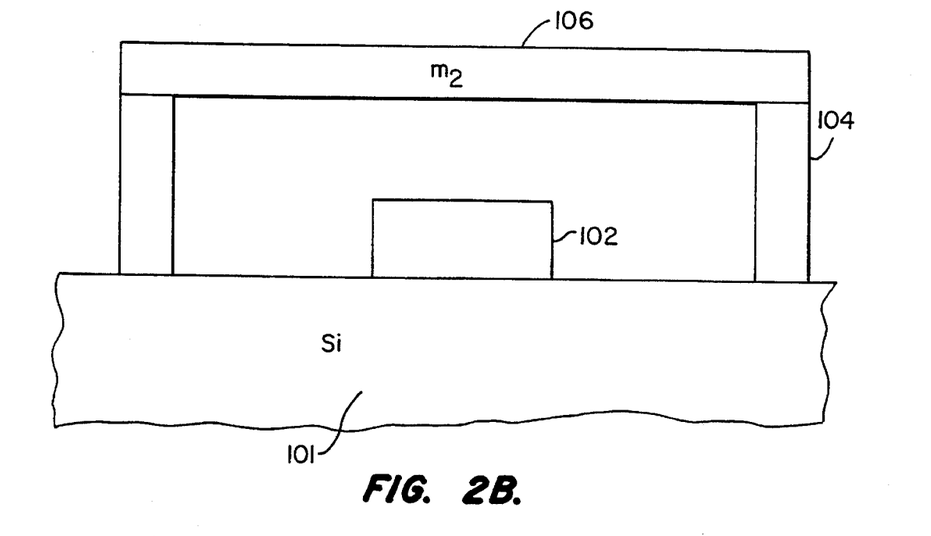
FIG. 2B illustrates a cross sectional view of the structure in FIG. 2A.

FIG. 2B illustrates a cross sectional view of shield structure 100 in FIG. 2A, as seen in the direction of the arrow. It shows EPROM memory cells 102, formed on silicon substrate 101, which is surrounded by first shield 104. FIG. 2 also illustrates a second shield 106 which is placed on the top of structure 100 and blocks any UV radiation impinging on memory cells 102 from the top. As shown in FIG. 2, the combination of shields 104 and 106 provide an enclosure that substantially diminishes any UV radiation impinging on the memory cell from all directions.

Figure 3A:
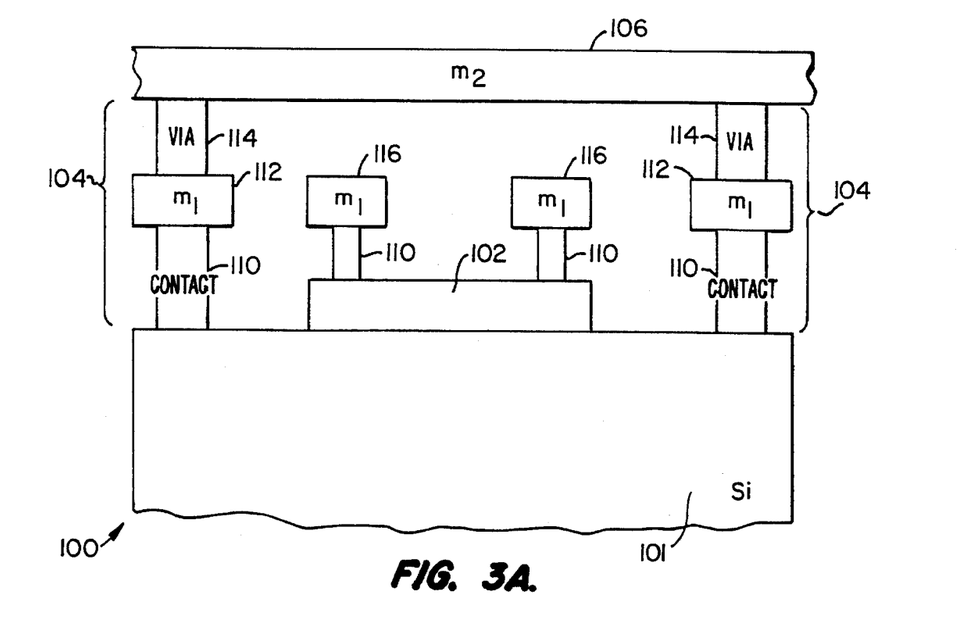
FIG. 3A illustrates a cross sectional view of an embodiment of the structure in FIG. 2A.

FIG. 3A shows a cross sectional view of an embodiment of structure 100 protecting a typical EPROM cell 102. FIG. 3A further shows semiconductor substrate 101, shield 104 represented by the specific layers of material forming it, and shield 106. FIG. 3A further illustrates how conductors from outside of structure 100 are connected to memory cell 102.

As shown in FIG. 3A, shield 104 is made of three layers of material: contact layer 110, metal-1 layer 112, and via layer 114. Contact layer 110 connects metal-1 layer 112 to semiconductor substrate 101. It is made of solid metallic material which is completely opaque to incident UV radiation. Via layer 114 connects metal-1 layer 112 to shield 106. Via layer 114 is also made of solid metallic material which is completely opaque to incident UV radiation.

The following steps illustrate how shield 104 of FIG. 3A is formed on silicon substrate 101: 1) a p-type junction is diffused into the p-substrate to form a substrate tap feature; 2) a long thin contact is placed in the center of the tap diffusion; 3) a metal-1 line which is wider than the contact is formed on the contact; and 4) an inter-metal via structure is formed on top of the metal-1 line. As a result, shield 104 is entirely made of metal and is completely opaque to UV radiation.

Shield 106 is made of a layer of metal-2 and, as mentioned before, blocks any impinging UV radiation on memory cell 102 from the top. As shown in FIG. 3A, metal-1 is also used to provide for conductive paths 116 which connect memory cell 102 to the outside of structure 100. Conductors 116 are connected to memory cell 102 via contact layers 110. In addition to metal-1 conductors, polysilicon conductors are also used to provide access to memory cell 102 in the embodiment of FIG. 3A. This will be better illustrated in our discussion of FIGS. 3B and 6, below.

Figure 3B:
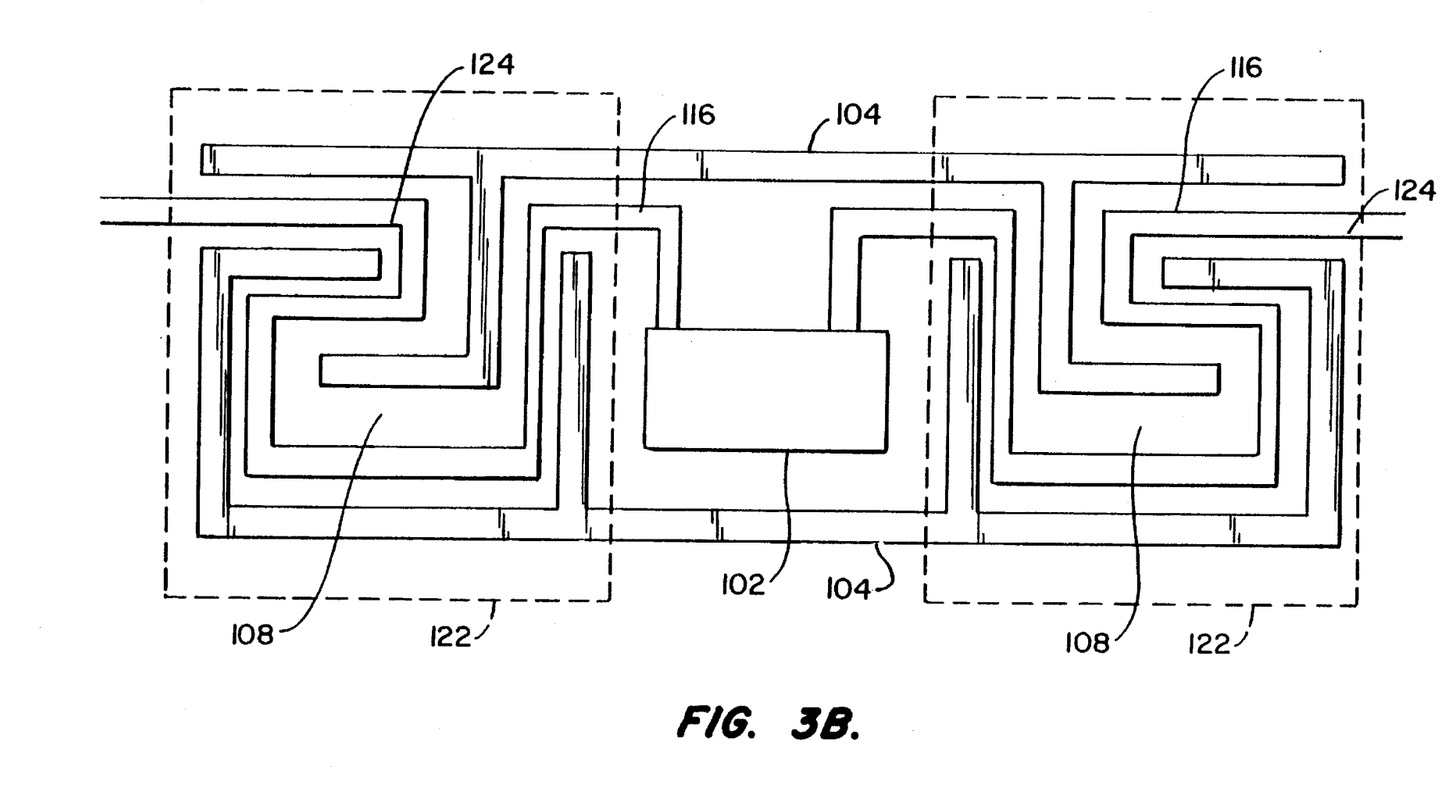
FIG. 3B illustrates a top view of the structure in FIG. 3A.
Figure 7:
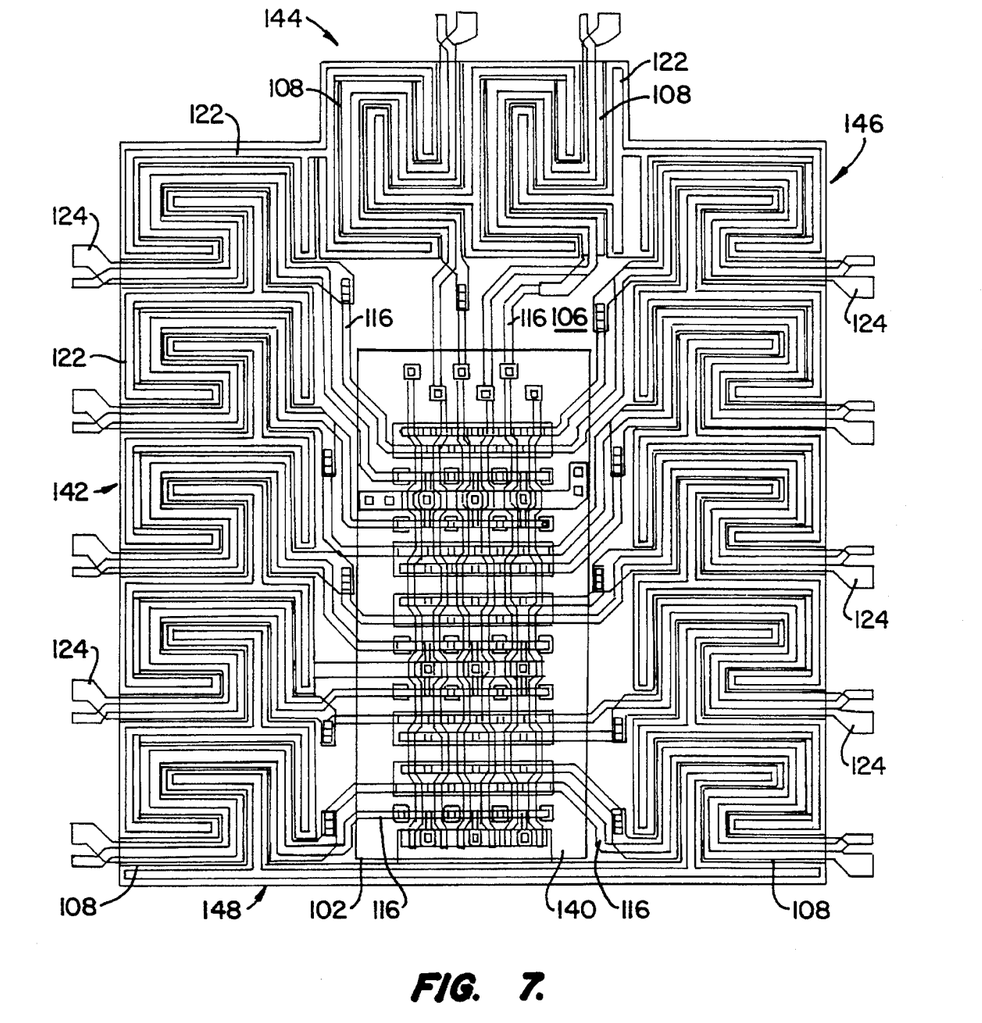
FIG. 7 illustrates an example of the embodiment of FIGS. 3A and 3B.

As mentioned before, shield 104 includes conductive signal paths 108 that allow for routing metal-1 or polysilicon conductors which connect memory cell 102 to the outside of structure 100. A pair of typical signal paths 108 are shown in FIG. 3B. FIG. 3B is the top view of the structure in FIG. 3A. As can be seen in FIG. 3B, shield 104 includes individual shielding members 122 with adjacent shield members connected to provide an enclosure around memory cell 102. Obviously, FIG. 3B is for illustration purposes and more shielding members are used as needed to construct a practical shield as shown in FIG. 7. The number of shielding members needed depends on the size of the memory array being protected by the shield structure. Each shielding member includes a conductive signal path 108 which is used to route one metal-1 conductor 116 and one polysilicon conductor 124.

Figure 4:
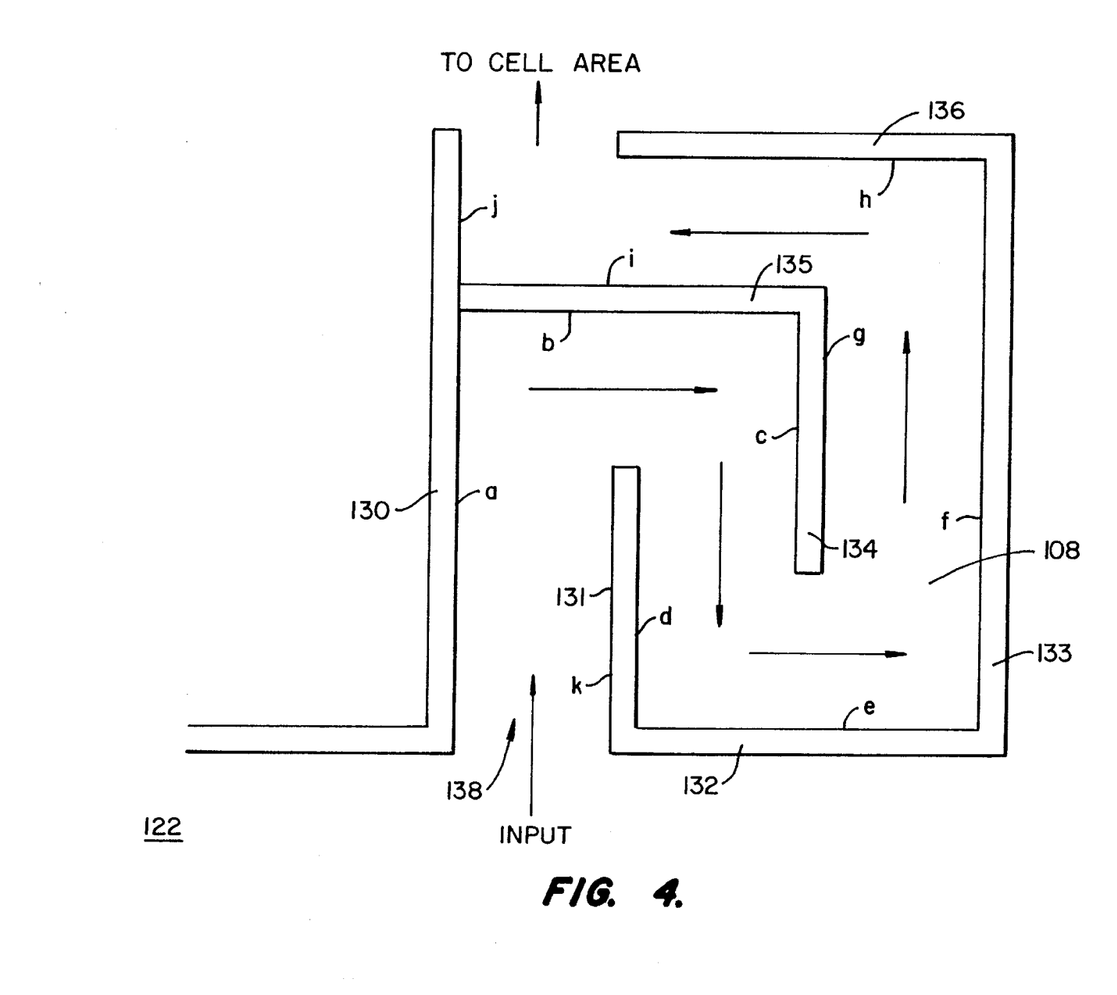
FIG. 4 illustrates a typical shielding member as shown in FIG. 3B.
Figure 5:
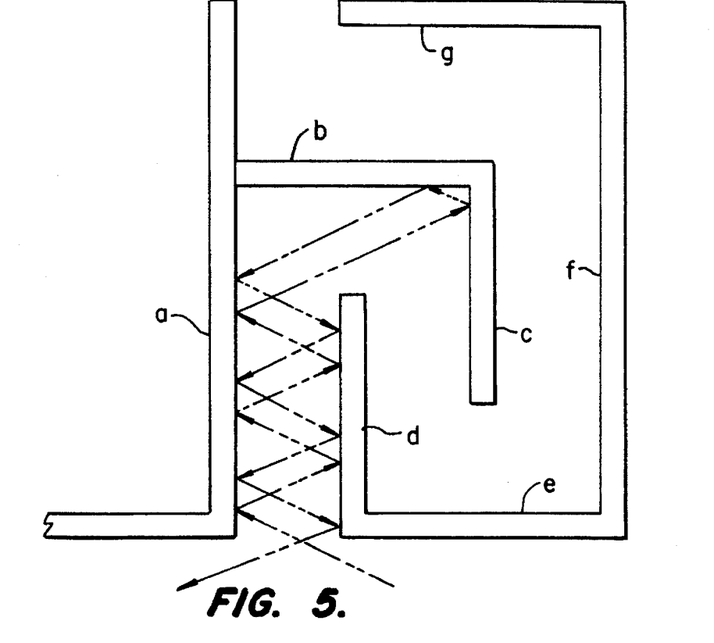
FIGS. 5 and 6 illustrate how UV radiation is reflected out of the signal path in the shielding member of FIG. 4.

FIG. 4 illustrates a typical shielding member 122 with a conductive signal path 108. Shielding member 122 has a labyrinthine structure and is formed by interconnecting individual walls 130–136 as shown in FIG. 5. Each wall 130–136 is formed using the above-mentioned four-step process. Conductive signal path 108 which is created by interconnecting walls 130–136 has a narrow aperture 138. Aperture 138 is designed to minimize the amount of radiation entering signal path 108 while routing the above-mentioned pair of conductors from outside of the shield structure to the inside. The labyrinthine structure of shielding member 122 provides the ability to substantially diminish and in many cases eliminate UV radiation entering aperture 138.

Figure 6:
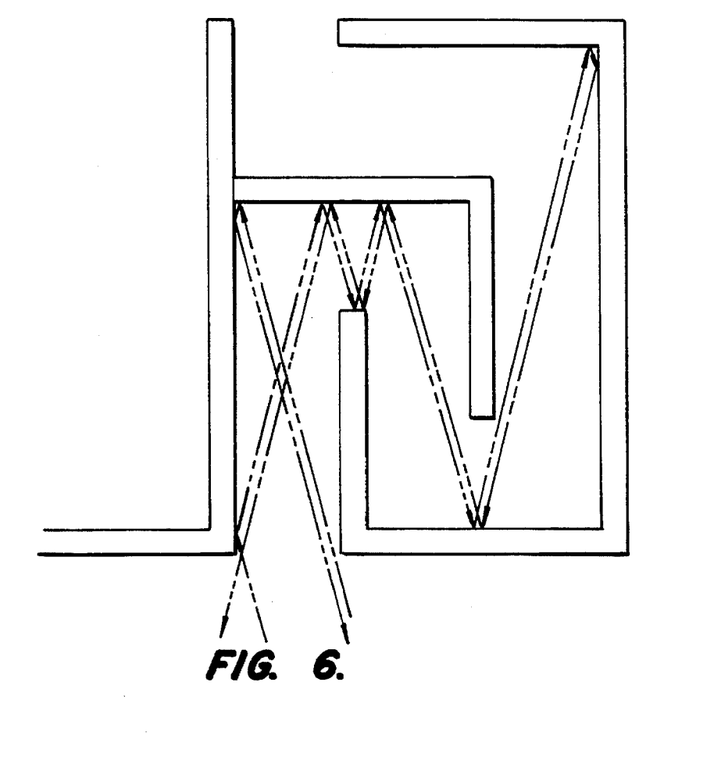

The protective properties of shielding member 122 with a labyrinthine structure can be better understood by reviewing FIGS. 5 and 6. FIGS. 5 and 6 illustrate an example of how the radiation is typically reflected out of conductive signal path 108 in FIG. 4. Referring to FIG. 4, walls 130–136 are made of three layers of metal, thus reflect most of the radiation incident on them. According to the laws of physics, the incident angle of a light ray is equal to its reflection angle. For example, if a light ray hit a surface area with a 30° angle, it reflects from that surface area with a 30° angle. Furthermore, any radiation entering aperture 138 in the plane of the silicon substrate, travels in a straight line, and will not traverse sharp bends or angles unless reflected around the angles.

Therefore, any radiation entering perpendicular to side "b" of wall 135 will reflect back out of aperture 138. On the other hand, any radiation entering aperture 138 at an angle is either reflected back out of aperture 138, as shown in FIGS. 5 and 6, or its energy is substantially diminished through successive reflections from surfaces "a" through "j" of walls 130–136, which then no longer poses a threat to the information stored in the memory cells being protected. Laboratory test results have shown that the labyrinthine structure of shielding member 122 in most cases eliminates the radiation before it reaches the cell area.

The ability to substantially diminish and in many cases eliminate the radiation entering the aforementioned signal paths enables the present invention to use as many shielding members 122 as needed to protect and access the protected cell area. Thus, there is no limitation on the number of memory cells that can be protected. Accordingly, the protected cell area can have as many memory cells as is required by the design in one shield structure.

FIG. 7 illustrates an example of the embodiment of FIG. 3A. FIG. 7 includes a cell area 1400 which includes a two dimensional EPROM memory cell 102. It further includes twelve shielding members 122, with each adjacent shielding member 122 connected to each other and positioned to protect cell area 140 from impinging UV radiation on sides 142–146. Side 148 is a solid wall made of the same three layers of material as the individual walls of each shielding member. The combination of the twelve shielding members 122 and solid wall 148 form shield 104 as shown in FIGS. 2 and 3A. As can be seen in FIG. 7, cell area 140 can be accessed from sides 142–146 through the plurality of conductive signal paths 108.

Figure 8:
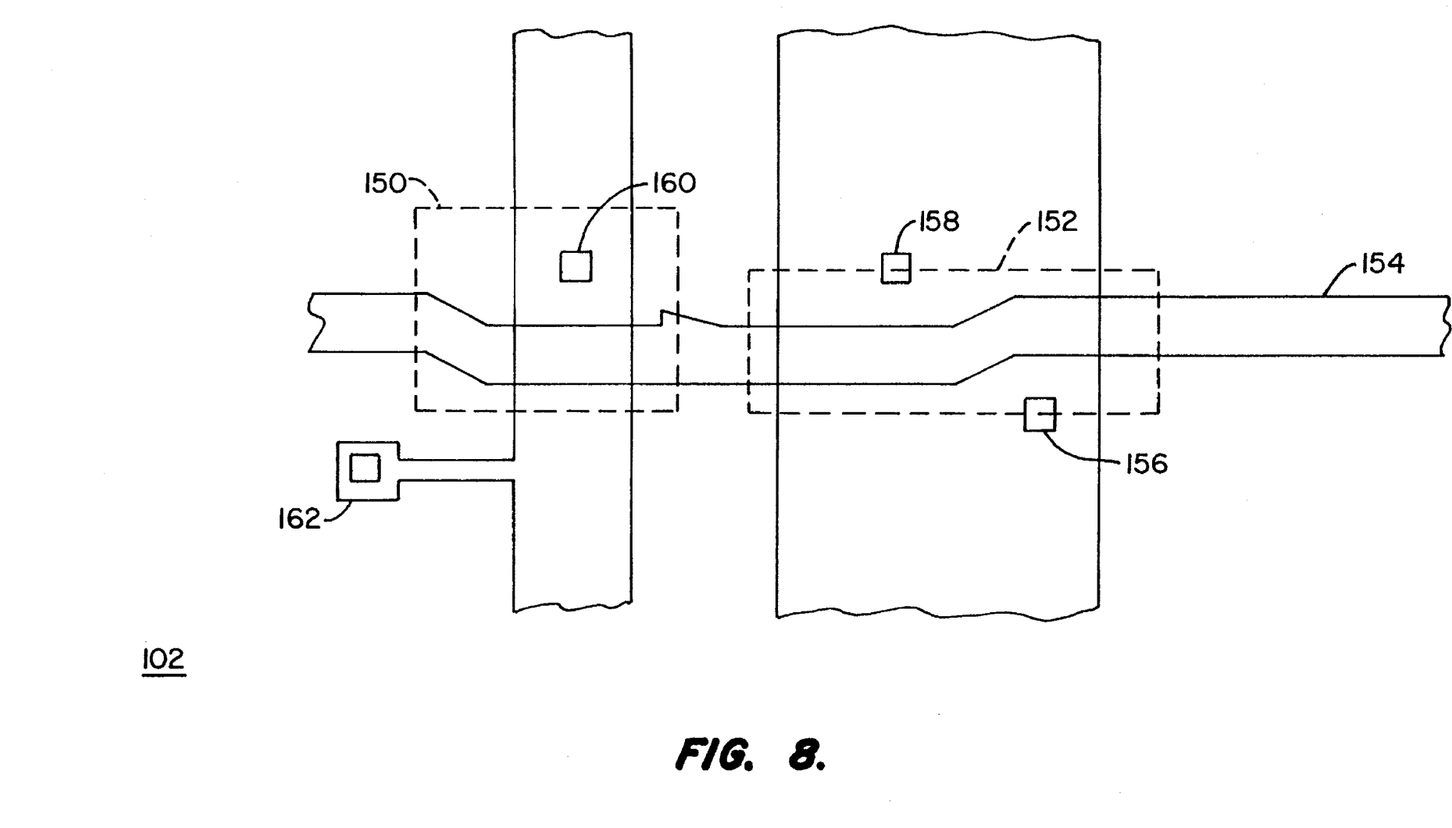
FIG. 8 illustrates the regent of a typical EPROM cell protected by the structure of the present invention.

The embodiment of FIG. 7 also includes shield 106 which covers cell area 140, all twelve shielding members 122, and solid wall 148. Shield 106 is shown by the dotted area in FIG. 8. As mentioned before, two conductors, one metal-1 and one polysilicon, are routed in each signal path. In FIG. 8, each polysilicon conductor 124 is represented by a wide line which is fully shaded and each metal-1 conductor 116 is represented by a narrow line. The resulting structure in FIG. 8 provides a two dimensional EPROM memory array 102 which is protected from impinging UV radiation from all sides and can be dynamically accessed via conductors 116 and 124.

FIG. 8 illustrates the typical EPROM memory cell 102 FIG. 8. Memory cell 102 includes a programming transistor 150 and a read transistor 152. Programming transistor 150 is used to program the memory cell with a bit of data. Read transistor 152 is used to retrieve the stored data. The pair of transistors share a common floating gate (not shown) and a common control gate 154. The common floating gate is directly underneath common control gate 154. Common control gate 154 is either accessed by a metal-1 conductor or a polysilicon conductor. This conductor passes to the outside of the shield structure. Drain 156 and source 158 of read transistor 152 are also accessed via the metal or polysilicon conductors (not shown). Either of these conductors are connected to drain 156 and source 158 through contacts 110 as shown in FIG. 3A.

Drain 160 of programming transistor 150 is accessed via a metal-1 conductor (not shown). Again, the metal-1 conductor is connected to drain 160 through a contact 110, as shown in FIG. 3A. In the example of FIG. 7, sources 162 of all programming transistors 150 are connected to shield layer 106 in FIG. 3A. As mentioned above, shield layer 106 which is made of a metal-2 is electrically connected to ground potential and to the substrate. In the Example of FIG. 7, each drain signal can serve four memory cells 102.

The present invention has now been explained with reference to a specific embodiment. Other embodiments will be apparent to those of ordinary skill in the art. It is therefore not intended that this invention be limited except as indicated by the appended claims.

What is claimed is:

1. A semiconductor structure comprising:

a semiconductor substrate having at least one electronically programmable read only memory cell;

a first shield, having a top side and a bottom side, positioned around said memory cell, said first shield includes a plurality of conductive paths positioned on all sides to provide for multiple interconnect paths, said first shield blocks substantially all light impinging on a side of said first shield;

a second shield coupled to said top side of said first shield, said second shield blocks all light impinging on said memory cell from the top; and wherein each of said plurality of conductive paths includes a narrow aperture which allows the passage of a first conductor, wherein said first conductor is made of metal, wherein said first shield blocks substantially all light, direct and reflected, impinging through said narrow aperture to said at least one electronically programmable read only memory cell.

2. The structure of claim 1 wherein said first shield comprising:

a plurality of labyrinthine shielding members positioned around said memory cell and each including one of said conductive paths.

3. The structure of claim 2 wherein adjacent ones of said plurality of labyrinthine shielding members are integral.

4. The structure of claim 3 wherein each of said labyrinthine shielding members comprises a plurality of interconnected walls, each wall including:

a contact layer coupled to said semiconductor substrate;

a metal-1 layer formed on top surface of said contact layer; and a via layer formed on top of said metal-1 layer.

5. The structure of claim 4 wherein said second shield is formed on the top surface of said via layer.

6. The structure of claim 1 wherein said second shield is made of metal-2.

7. The structure of claim 1 wherein said narrow aperture allows the passage of a second conductor.

8. The structure of claim 7 wherein said first conductor is made of metal-1.

9. The structure of claim 7 wherein said second conductor is made of polysilicon.

10. A semiconductor structure comprising:

a semiconductor substrate having at least one electronically programmable read only memory cell;

a plurality of repeated shielding members positioned around said memory cell to provide a shield enclosure, each of said plurality of repeated shielding members including a conductive path for conductive interconnect, whereby said plurality of repeated shielding members provide for multiple conductive paths and block substantially all light impinging on a side of said shield enclosure;

a top shield coupled to the top of said plurality of repeated shielding members, said top shield blocking all light impinging on said memory cell from the top; and wherein each of said repeated shielding members includes a narrow aperture which allows the passage of a first conductor, wherein said first conductor is made of metal, wherein each of said plurality of repeated shielding members blocks substantially all light, direct and reflected, impinging through said narrow aperture to said at least one electronically programmable read only memory cell.

11. The structure of claim 10 wherein adjacent ones of said shielding members are integrated.

12. The structure of claim 10 wherein each of said plurality of shielding members has a labyrinthine structure.

13. The structure of claim 10 wherein each of said plurality of shielding members comprises a plurality of interconnected walls, each of said walls including:

a connect layer coupled to said semiconductor substrate;

a metal-1 layer formed on top surface of said contact layer; and a via layer formed on top of said metal-1 layer.

14. The structure of claim 13 wherein said top shield is formed on top of said via layer.

15. The structure of claim 10 wherein said top shield is made of metal-2.

16. The structure of claim 10 wherein said narrow aperture allows the passage of a second conductor.

17. The structure of claim 16 wherein said first conductor is made of metal-1.

18. The structure of claim 17 wherein said second conductor is made of polysilicon.

19. A semiconductor structure, comprising:

a semiconductor substrate having a two-dimensional array of electronically programmable read only memory cells in a center location;

a plurality of shielding members, each shielding member substantially repeated and positioned laterally adjacent to another, positioned around said array of memory cells in said center location to provide a shield enclosure, each of said plurality of shielding members including a labyrinthine conductive path for conductive interconnect, whereby said plurality of shielding members provide for multiple conductive paths and block substantially all light impinging on a side of said shield enclosure;

a top shield coupled to top of said plurality of shielding members, said top shield blocking all light impinging on said array of memory cells from top; and wherein each of said plurality of labyrinthine conductive paths includes a narrow aperture which allows the passage of a first conductor, wherein said first conductor is made of metal, wherein each of said plurality of labyrinthine conductive paths blocks substantially all light, direct and reflected, impinging through said narrow aperture to said array of electronically programmable read only memory cells.

20. The structure of claim 19 wherein adjacent ones of said shielding members are integrated.

21. The structure of claim 19 wherein each of said plurality of shielding members has a labyrinthine structure.

22. The structure of claim 19 wherein each of said plurality of shielding members comprises a plurality of interconnected walls, each of said walls including:

a contact layer coupled to said semiconductor substrate;

a metal-1 layer formed on top surface of said contact layer; and a via layer formed on top of said metal-1 layer.

23. The structure of claim 22 wherein said top shield is formed on top of said via layer.

24. The structure of claim 19 wherein said top shield is made of metal-2.

25. The structure of claim 19 wherein said narrow aperture allows the passage of a second conductor.

26. The structure of claim 25 wherein said first conductor is made of metal-1 layer.

27. The structure of claim 26 wherein said second conductor is made of polysilicon.

28. The semiconductor structure of claim 1 wherein each of said plurality of conductive paths has at least six 90-degree turns and at least two 180-degree reversals in direction.

29. The semiconductor structure of claim 28 wherein lengths of said reversals in direction are about equal.

30. The semiconductor structure of claim 1 wherein an input for said plurality of conductive paths of said first shield is parallel with an output for said plurality of conductive paths of said first shield.

31. The semiconductor structure of claim 10 wherein said conductive path for conductive interconnect has at least six 90-degree turns and at least two 180-degree reversals in direction.

32. The semiconductor structure of claim 31 wherein lengths of said reversals in direction are about equal.

33. The semiconductor structure of claim 10 wherein an input for said conductive path of each of said plurality of shielding members is parallel with an output for said conductive path of each of said plurality of shielding members.

34. The semiconductor structure of claim 19 wherein said conductive path for conductive interconnect has at least six 90-degree turns and at least two 180-degree reversals in direction.

35. The semiconductor structure of claim 34 wherein lengths of said reversals in direction are about equal.

36. The semiconductor structure of claim 19 wherein an input for each of said plurality of shielding members is parallel with an output for each of said plurality of shielding members.

37. A semiconductor structure comprising:

a semiconductor substrate having at least one electrically programmable read only memory cell;

a plurality of conductive paths, coupled to said semiconductor substrate, each path comprising:

a narrow aperture for passage of a first conductor, wherein said first conductor is metal;

at least six 90-degree turns and at least two 180-degree reversals in direction; and an input, parallel to an output;

a first shield, having a top side and a bottom side, coupled to said semiconductor substrate and positionable to surround said at least one electrically programmable read only memory cell, said first shield comprising said plurality of conductive paths to provide for multiple interconnect paths and comprising a labyrinthine structure enclosing said plurality of conductive paths, said first shield blocking substantially all light impinging on a side of said first shield and substantially all light impinging through said narrow aperture to said at least one electrically programmable read only memory cell; and a second shield, coupled to said top side of said first shield, said second shield blocking all light impinging on said memory cell from the top.

38. The semiconductor structure of claim 37 wherein lengths of said reversals in direction are about equal.

39. The structure of claim 37 wherein each of said labyrinthine shielding members comprises a plurality of interconnected walls, wherein each wall comprises:

a contact layer coupled to said semiconductor substrate;

a metal-1 layer formed on top surface of said contact layer; and a via layer formed on top of said metal-1 layer.

40. The structure of claim 39 wherein said second shield is formed on the top surface of said via layer.

41. The structure of claim 37 wherein said second shield is made of metal-2.

42. The structure of claim 37 wherein said narrow aperture allows the passage of a second conductor.

43. The structure of claim 37 wherein said first conductor is made of metal-1.

44. The structure of claim 42 wherein said second conductor is made of polysilicon.

45. A layout structure for a semiconductor substrate comprising:

an array of programmable memory cells erasable using ultraviolet radiation formed on said semiconductor substrate;

repeated labyrinthine paths formed on a surface of said semiconductor substrate, said labyrinthine paths laterally and substantially repeated to surround said array of memory cells, each labyrinthine path comprising at least five ninety-degree turns, each labyrinthine path with its own blocking structure to prevent substantially all ultraviolet radiation impinging on a side of each of said repeated labyrinthine paths and substantially all ultraviolet radiation impinging through a narrow aperture through each labyrinthine path to said array of programmable memory cells;

a top shield, coupled to a top side of said repeated labyrinthine paths, said top shield blocking all ultraviolet radiation impinging on said array of programmable memory cell from the top; and an array of metal conductors formed on said surface of said semiconductor substrate, wherein at least one of said array of metal conductors passing through each of said narrow apertures in said repeated labyrinthine paths, said array of metal conductors is coupled to said array of programmable memory cells.

46. The layout of a semiconductor structure of claim 45 wherein said at least five ninety-degree turns comprises a first turn in a first direction, a second turn in said first direction, a third turn in a second direction, a fourth turn in said second direction, and a fifth turn in said second direction.

47. The layout of a semiconductor structure of claim 46 wherein said second turn occurs after said first turn, said third turn occurs after said second turn, said fourth turn occurs after said third turn, and said fifth turn occurs after said fourth turn.

48. The layout of a semiconductor structure of claim 46 further comprising a sixth turn in said first direction.

* * * * *